US012704575B2

(12) United States Patent
Nehrke et al.

(10) Patent No.: US 12,704,575 B2
(45) Date of Patent: Aug. 11, 2026

(54) DIFFUSION MAPPING BY MR FINGERPRINTING

(71) Applicant: KONINKLIJKE PHILIPS N.V., Eindhoven (NL)

(72) Inventors: Kay Nehrke, Ammersbek (DE); Thomas Erik Amthor, Hamburg (DE); Peter Ulrich Boernert, Hamburg (DE); Mariya Ivanova Doneva, Luneburg (DE); Peter Koken, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 177 days.

(21) Appl. No.: 18/842,186

(22) PCT Filed: Feb. 22, 2023

(86) PCT No.: PCT/EP2023/054407
§ 371 (c)(1),
(2) Date: Aug. 28, 2024

(87) PCT Pub. No.: WO2023/165865
PCT Pub. Date: Sep. 7, 2023

(65) Prior Publication Data

US 2025/0180685 A1 Jun. 5, 2025

(30) Foreign Application Priority Data

Mar. 1, 2022 (EP) .................................... 22159441

(51) Int. Cl.
*G01R 33/56* (2006.01)
*G01R 33/485* (2006.01)
(Continued)

(52) U.S. Cl.
CPC ......... *G01R 33/561* (2013.01); *G01R 33/485* (2013.01); *G01R 33/50* (2013.01); *G01R 33/5608* (2013.01)

(58) Field of Classification Search
CPC .... G01R 33/561; G01R 33/485; G01R 33/50; G01R 33/5608; G01R 33/543; G01R 33/443; G01R 33/448; G01R 33/56341
See application file for complete search history.

(56) References Cited

U.S. PATENT DOCUMENTS

2015/0301138 A1 10/2015 Griswold et al.
2018/0106876 A1 4/2018 Nielsen et al.
(Continued)

FOREIGN PATENT DOCUMENTS

EP 3336570 A1 6/2018

OTHER PUBLICATIONS

International Search Report and Written Opinion from PCT/EP2023/054407 mailed Apr. 20, 2023.
(Continued)

*Primary Examiner* — G. M. A Hyder

(57) ABSTRACT

The invention relates to a method of MR imaging of an object (10) placed in an examination volume of an MR system (1). It is an object of the invention to enable quantitative diffusion MR imaging based on the generation of a temporally incoherent MR signal evolution by variation of acquisition parameters (like in MRF or MR STAT). The method comprises the steps of: subjecting the object (10) to an imaging sequence composed of a train of sequence blocks, each sequence block comprising at least one RF pulse, at least one switched spoiling magnetic field gradient and at least one switched readout magnetic field gradient defining a k-space sampling pattern, and having associated therewith a set of acquisition parameters including the
(Continued)

zeroth moment of the spoiling magnetic field gradient; acquiring the MR signals while varying at least the zeroth moment of the spoiling magnetic field gradient and, optionally, one or more further acquisition parameters during the course of the imaging sequence; and reconstructing at least one MR image, wherein at least a diffusion coefficient and, optionally, one or more further MR parameters are computed for a number of image positions from an incoherent temporal evolution of the acquired MR signals caused by the variation of the at least one acquisition parameter. Moreover, the invention relates to an MR system (1) for carrying out this method as well as to a computer program to be run on an MR system.

10 Claims, 4 Drawing Sheets

(51) Int. Cl.

*G01R 33/50* (2006.01)
*G01R 33/561* (2006.01)

(56) References Cited

U.S. PATENT DOCUMENTS

| | | | | |
|---|---|---|---|---|
| 2019/0265322 | A1 | 8/2019 | Griswold et al. | |
| 2019/0361086 | A1 | 11/2019 | Nittka et al. | |
| 2020/0379071 | A1* | 12/2020 | Gong | G01R 33/5608 |
| 2021/0259775 | A1 | 8/2021 | Kustra et al. | |
| 2022/0099777 | A1* | 3/2022 | Dispenza | G01R 33/56554 |

OTHER PUBLICATIONS

Cohen et al "Simultaneous Diffusion PD, T1 and T2 mapping with Optimized MR Fingerprinting EPI" Proceedings of the Int. Soc. for Magnetic Resonance in Med, vol. 26, Jun. 1, 2018.

Yuta Kobayashi eet al., "Diffusion-weighting Caused by Spoiler Gradients in the Fast Imaging with Steady-state Precession Sequence May Lead to Inaccurate T2 Measurements in MR Fingerprinting" Magn. Reson Med. Sci. 2019 18 p. 96-104.

Sbrizzi et al "Fast Quantitative MRI as a Nonlinear Tomography Problem" Magnetic Resonance Imaging 46 p. 56-62 2018.

Ma D, Gulani V, Seiberlich N, Liu K, Sunshine JL, Duerk JL, Griswold MA. Magnetic resonance fingerprinting. Nature. 2013;495(7440):187-92.

Yun Jiang "MR Fingerprinting Using the Quick Echo Splitting NMR Imaging Technique" Magnetic Resonance in Med. 77 p. 979-988 (2017).

Xiang Gao "Three-dimensional spatially resolved phase graph framework" Magnetic Resonance in Med. 2021 p. 551-560.

A. Panda et al "MR Fingerprinting and ADC Mapping for Characterization of Lesions in the Transition Zone of the Prostate Gland" Radiology, 2019.

Shaihan J. Malik et al., "Extended Phase Graph Formalism for Systems With Magnetization Transfer and Exchange" Magnetic Resonance in Med. 80 p. 767-779 (2018).

Aaron T. Hess "Hexagonal Gradient Scheme With RF Spoiling Improves Spoiling Performance for High-Flip-Angle Fast Gradient Echo Imaging" Magnetic Resonance in Med. 77 p. 1231-1237 (2017).

* cited by examiner

DIFFUSION MAPPING BY MR FINGERPRINTING

CROSS REFERENCE TO RELATED APPLICATIONS

This application is a U.S. national phase application of International Application No. PCT/EP2023/054407 filed on Feb. 22, 2023, which claims the benefit of EP Application Serial No. 22159441.9 filed on Mar. 1, 2022 and is incorporated herein by reference.

FIELD OF THE INVENTION

The invention relates to the field of magnetic resonance (MR) imaging. It concerns a method of MR imaging of an object. The invention also relates to an MR system and to a computer program to be run on an MR system.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

MR fingerprinting (MRF) uses the generation of a temporally incoherent MR signal evolution (forming a "fingerprint") for different material (tissue) types through continuous variation of the acquisition parameters, such as the flip angle, the radiofrequency (RF) phase, the repetition time (TR), and the k-space sampling pattern, during the course of the used imaging sequence (see: Nature 495:187-192, 2013). To this end, the imaging sequence is composed of a train of sequence blocks, of which each comprises at least one RF pulse and at least one switched readout magnetic field gradient defining a k-space sampling pattern. An individual set of acquisition parameters is associated with each sequence block. A pattern matching algorithm matches the fingerprints to a predefined dictionary of predicted MR signal evolution patterns. The so obtained MR parameter maps, such as $T_1$, $T_2$, frequency shift and proton density maps, others are conceivable as well, are estimated from the best signal matching. Because of the incoherent sampling and the nature of the matching procedure based on prior knowledge, MRF has been shown to be comparatively insensitive with regard to errors even in combination with a highly undersampled k-space acquisition causing severe aliasing artifacts.

In the so-called MR STAT technique (Magnetic Resonance Spin Tomography in Time-domain, see: Magnetic Resonance Imaging 46:56-62, 2018) the ensemble of magnetic spins in the examined object is treated as a large-scale nonlinear dynamical system, which is probed by superimposing a train of imaging sequence blocks with incoherently varying acquisition parameters (as in MRF). Quantitative MR imaging is performed on this basis as a one step process; signal localization and parameter quantification are simultaneously obtained by the solution of a large scale nonlinear inversion problem. Quantitative parameter maps are reconstructed by employing nonlinear optimization algorithms and parallel computing infrastructures which do not rely on Fourier transformation. The advantage of MR STAT is that the constraints on the measurement process can be relaxed and acquisition schemes that are time efficient and widely available in clinical MR imaging scanners can be employed. The downside is that the reconstruction procedure (involving solving an inversion problem with typically about $10^5$ unknowns) is computationally very complex and demanding.

Diffusion-weighted imaging (DWI) is an important MRI technique, e.g. for the detection of acute ischemic stroke or for the characterization and differentiation of brain tumors. In DWI, the apparent diffusion coefficient (ADC) as a measure of the magnitude of diffusion (of water molecules) within tissue can be quantitatively assessed by varying the amplitude and/or the duration of switched magnetic field gradients and/or TR.

However, the known quantitative techniques like MRF and MR STAT are not well-suited for addressing diffusion as an important MR contrast parameter. This is caused inter alia by the fact that the Extended Phase Graphs formalism (EPG, see, e.g., Journal of Magnetic Resonance Imaging 41:266-295, 2015, or M. T. Vlaardingerbroek and J. A. den Boer: Magnetic Resonance Imaging, Theory and Practice, 3. ed, Springer, 2002) employed for calculation of the required dictionary of predicted MR signal evolution patterns shows some problems in the treatment of diffusion. A major drawback of the EPG approach is that for the TR and the zeroth gradient moment $k_0$ of the spoiling magnetic field gradients contained in the imaging sequence fixed values have to be used throughout the entire pulse train to have a synchronous phase evolution of switched and static (field inhomogeneity, susceptibility or $T_2$*-induced) magnetic field gradients, which ensures that MR echo signals generated by both switched and static magnetic field gradients are simultaneously refocused (hereinafter referred to as pure coherences). A non-synchronous phase evolution would refocus MR echo signals caused by switched and static magnetic field gradients at different points in time, leading to artifacts in the MR signal data due to a superposition of different echo times (hereinafter referred to as impure coherences). On the other hand, the use of a fixed $k_0$ throughout the sequence makes it difficult to distinguish diffusion from $T_2$ decay in the incoherent MR signal evolution, as both lead to a qualitatively similar decay of transverse magnetization. For diffusion mapping, a significant variation of $k_0$ is required for properly encoding diffusion in the acquired MR signal data evolution.

SUMMARY OF THE INVENTION

Against this background it is readily appreciated that there is a need for an improved quantitative MR imaging technique. It is an object of the invention to enable quantitative diffusion MR imaging based on the generation of a temporally incoherent MR signal evolution by variation of acquisition parameters (like in MRF or MR STAT).

In accordance with the invention, a method of MR imaging of an object placed in an examination volume of an MR system is disclosed. The method comprises the steps of:

subjecting the object to an imaging sequence composed of a train of sequence blocks, each sequence block comprising at least one RF pulse, at least one switched spoiling magnetic field gradient and at least one switched readout magnetic field gradient defining a k-space sampling pattern, and having associated therewith a set of acquisition parameters including the zeroth moment of the spoiling magnetic field gradient, acquiring the MR signals while varying at least the zeroth moment of the spoiling magnetic field gradient and, optionally, one or more further acquisition parameters during the course of the imaging sequence, and reconstructing at least one MR image, wherein at least a diffusion coefficient and, optionally, one or more further MR parameters are computed for a number of image positions from an incoherent temporal evolution of the acquired MR signals caused by the variation of the at least one acquisition parameter.

The technique of the invention generally corresponds to the above-mentioned MR imaging techniques (MRF or MR STAT). MR signals are generated by a train of sequence blocks with varying acquisition parameters generating a characteristic incoherent MR signal evolution (fingerprint) from which the MR parameters are quantitatively derived for each image position. Instead of fixed spoiling magnetic field gradients, as commonly applied in spoiled gradient echo imaging sequences, the invention proposes a gradient echo sequence scheme with variable spoiling magnetic field gradients and, optionally, further variable acquisition parameters. The method of the invention enables diffusion mapping as the variation of the zeroth moment ($k_0$) of the spoiling magnetic field gradients provides diffusion encoding in the generated incoherent temporal evolution of the acquired MR signals, namely in such a fashion that diffusion is well distinguishable from other MR parameters (such as transverse relaxation times).

It is an insight of the invention that it is possible (by suitably selecting the variation pattern of $k_0$) to suppress the above-mentioned impure coherences in which MR echo signals caused by static magnetic field inhomogeneities are not fully refocused. Thus, undesirable artifacts in the acquired MR signal data due to superpositions of different echo times can be avoided by the invention.

In a possible embodiment, the imaging sequence is comprised of two or more types of sequence blocks, e.g. type a and type b, wherein each type is assigned a fixed value of $k_0$ ($k_{0a}$ and $k_{0b}$). Each type may further be assigned a fixed repetition time $TR_a$ and $TR_b$. Sequence blocks of the two (or more) types can be arbitrarily interleaved.

In an embodiment of the invention, the fixed values of $k_0$ of the different sequence block types are pairwise coprime integer multiples of a unit spoiling gradient value. E.g., $k_{0a}$ and $k_{0b}$ can be chosen according to the relation:

$$k_{0a} = n_a \cdot k_0,\ k_{0b} = n_b \cdot k_0$$

wherein $n_a$ and $n_b$ are coprime positive integer numbers (i.e. share no divisors except 1), and $k_0$ is a unit spoiling gradient moment large enough to de-phase the MR signal (i.e., $k_0$ should be large enough to cause a phase shift of the transverse magnetization of 2× or more). The latter condition guarantees that there is no leakage of neighboring magnetization states into the acquired MR signal. It turns out that with the above selection of $k_{0a}$ and $k_{0b}$ at least n repetitions of type a sequence blocks and $n_a$ repetitions of type b sequence blocks are required before refocusing of an impure coherence occurs. The actual number depends also on the interleaving scheme of the different sequence block types. Hence, the undesirable impure coherences can be suppressed by choosing a sufficiently large value for at least one of the coprime numbers $n_a$ and $n_b$. Preferably, the ratio of two coprime numbers is at least 5, preferably at least 10, most preferably at least 20. Suppression of impure coherences is effected in this way by the long train of sequence blocks this coherence undergoes before having a chance to be refocused. The train of sequence blocks comprising many RF pulses of different flip angles reduces the absolute strength of this coherence from RF pulse to RF pulse. Thus, the impure coherences are diluted and damped by relaxation and hence, are too weak to significantly degrade the acquired MR signal data. Both the choice of the coprime numbers $n_a$ and $n_b$ and of the interleaving pattern of the different sequence block types may be used to optimize suppression of impure coherences. It has to be noted that the TRs for the two or more sequence block types may be arbitrarily selected. It is conceivable to use more than two different sequence block types.

In a possible embodiment, the further acquisition parameters varied during the course of the imaging sequence are one or more of: repetition time, echo time, flip angle, RF pulse phase and/or frequency, k-space sampling pattern, readout magnetic field gradient and/or longitudinal magnetization preparation. Like in the conventional MRF technique, an MR signal acquisition scheme is applied that causes MR signals from different materials to be spatially and temporally incoherent by continuously varying the acquisition parameters throughout the data acquisition process. The mentioned acquisition parameters can be used for this purpose in addition to the variation of the zeroth moment of the spoiling magnetic field gradient as described before. The acquisition parameters can be varied in a random manner, pseudorandom manner, or other manner that results in MR signals from different materials to be spatially incoherent, temporally incoherent, or both.

As mentioned before, the variation of the acquisition parameters achieves spatial incoherence, temporal incoherence, or both, by varying the acquisition parameters (including $k_0$) from one sequence block to the next. This creates a time series of MR images with varying contrast. The MRF reconstruction process is designed to map any of a wide variety of MR parameters, such, as discussed above, the diffusion coefficient and, optionally, the longitudinal relaxation time $T_1$, the transverse relaxation time $T_2$, the main or static magnetic field $B_0$, the RF magnetic field $B_1$, and the spin (proton) density. To achieve this, the temporal evolution of the acquired MR signal data is compared with a dictionary of MR signal evolution patterns that have been generated in advance for different acquisition parameters based on MR signal models, such as Bloch equation-based physics simulations or, preferably, the (computationally much simpler and, thus, more efficient) extended phase graphs (EPG) formalism (see above). This comparison allows for the estimation of the MR parameters of interest. In general, the MR parameters at a given image position are estimated to be the parameters that provide the best match between the acquired MR signal evolution and the predicted MR signal evolution pattern. A conventional pattern matching algorithm may be used for this purpose.

In an embodiment of the invention, the RF pulses of at least some of the sequence blocks are chemical shift-selective. This can be used, e.g., to achieve fat suppression.

The method of the invention described thus far can be carried out by means of an MR system comprising at least one main magnet coil for generating a main magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control computer for controlling a temporal succession of RF pulses and switched magnetic field gradients based on an examination protocol, and a reconstruction unit for reconstructing MR images from the received MR signals.

The method of the invention can be implemented, for example, by a corresponding programming of the reconstruction unit and/or the control unit of the MR system.

The method of the invention can be advantageously carried out in most MR systems in clinical use at present. To this end it is merely necessary to utilize a computer program by which the MR system is controlled such that it performs the above-explained method steps of the invention. The computer program may be present either on a data carrier or be present in a data network so as to be downloaded for installation in the control unit of the MR system.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
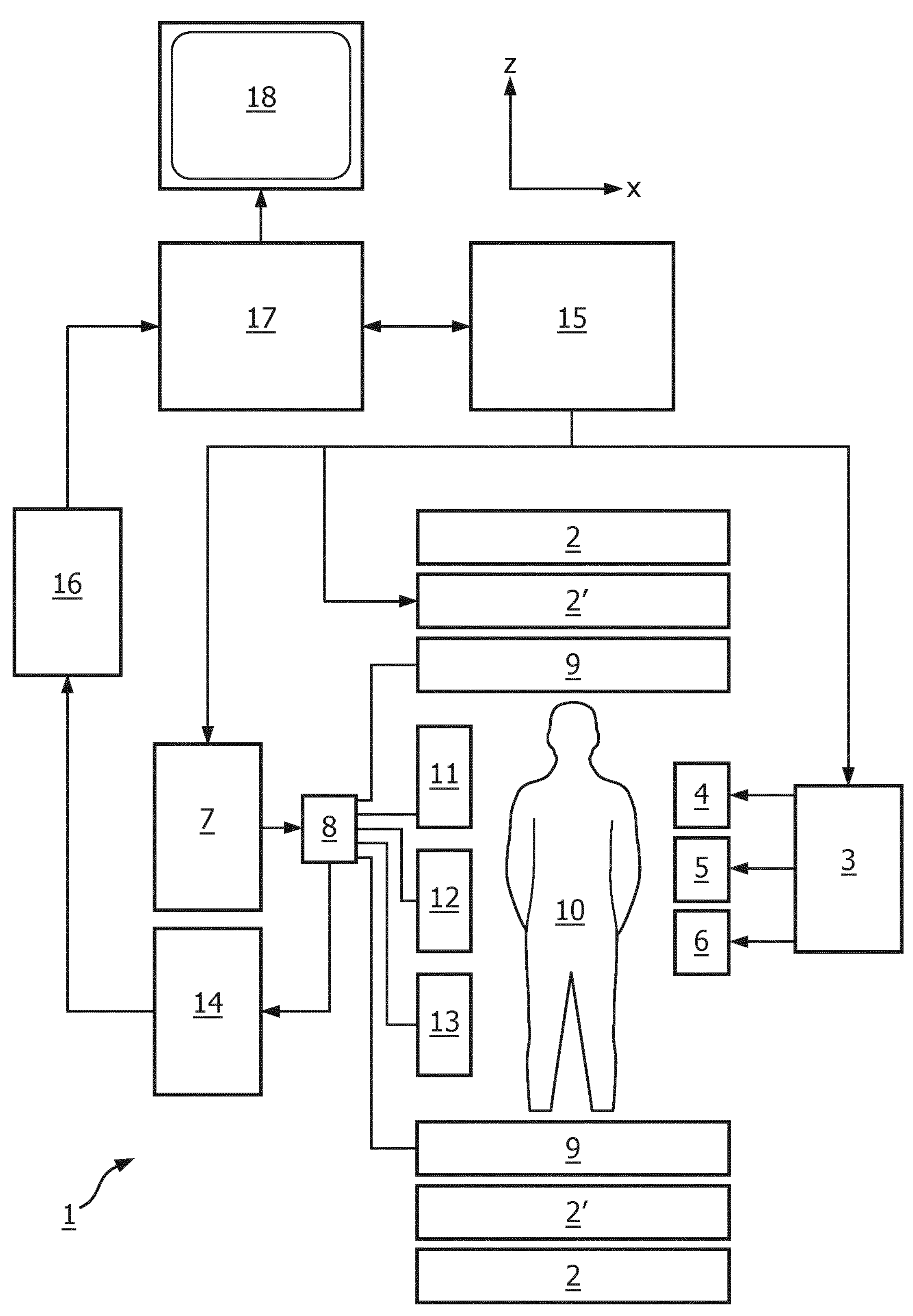
FIG. 1 shows an MR system for carrying out the method of the invention.

With reference to FIG. 1, an MR system 1 is shown. The system comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of an object (a body of a patient) 10 positioned in the examination volume.

For generation of MR images of limited regions of the body 10 by means of parallel imaging, a set of local RF coils 11, 12, 13 are placed contiguous to the region selected for imaging. The resultant MR signals are picked up by the RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR systems the data acquisition system 16 is a separate computer, possibly a remote server "in the cloud", which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

With continuing reference to FIG. 1 and with further reference to FIGS. 2-5 embodiments of the imaging approach of the invention are explained.

As described above, MR signals are generated according to the invention by a train of sequence blocks of a spoiled gradient echo imaging sequence with varying acquisition parameters generating a characteristic incoherent MR signal evolution (fingerprint) from which maps of the diffusion coefficient and further MR parameters can be derived. The invention uses a gradient echo sequence scheme with variable spoiling magnetic field gradients to enable diffusion mapping, wherein contributions from impure coherences, in which MR echo signals caused by static magnetic field inhomogeneities are not fully refocused, are suppressed.

In an embodiment of the invention, the imaging sequence is comprised of two types of sequence blocks, type a and type b, wherein each type is assigned a fixed value of the zeroth moment of the spoiling magnetic field gradient applied in the sequence blocks of the respective type. The two different fixed values are referred to as $k_{0a}$ and $k_{0b}$.

Figure 2:
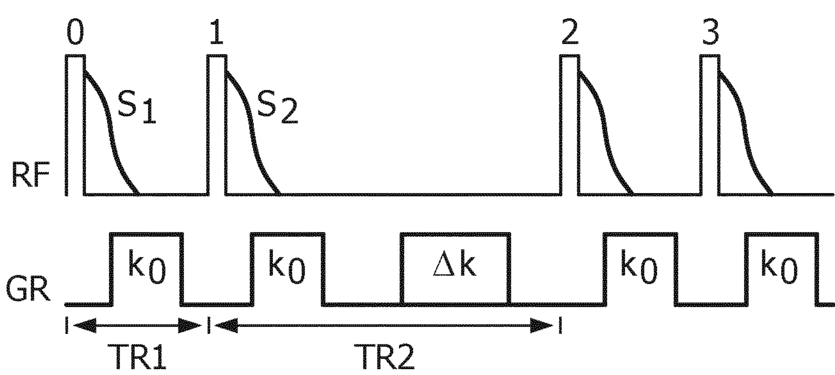
FIG. 2 schematically shows an example of an imaging sequence employed according to the invention.

In the embodiment shown in FIG. 2 showing the first four sequence blocks of a possible gradient echo sequence to be used in accordance with the invention, $k_a=k_0$ and $k_b=k_0+\Delta k$, wherein $TR_a=TR1$ and $TR_b=TR2$.

Figure 3:
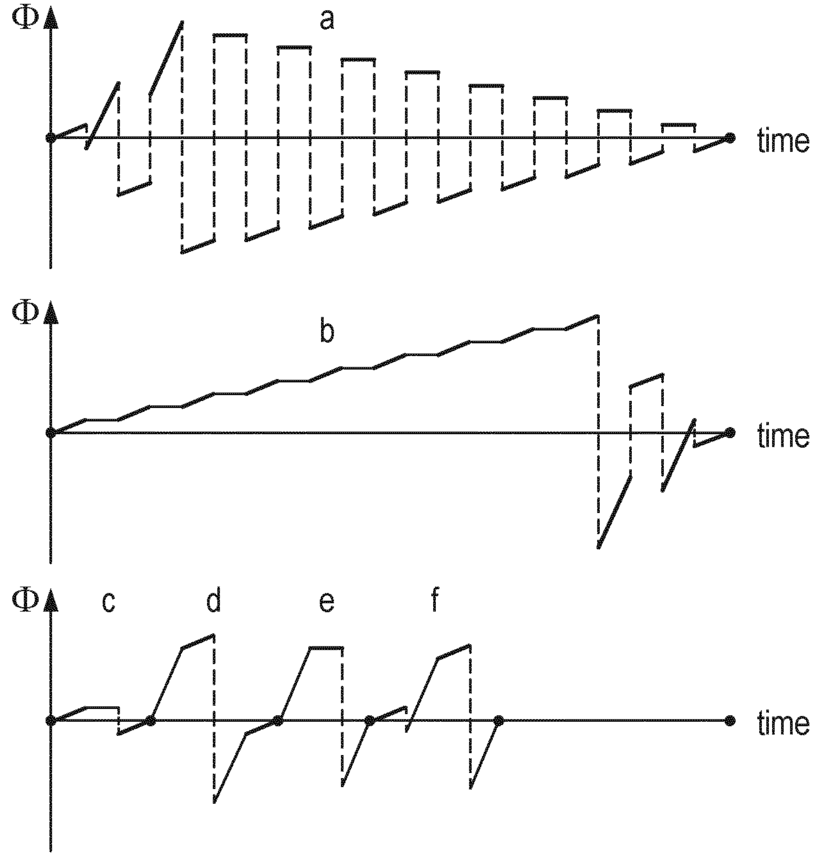
FIG. 3 shows phase graphs of different coherence pathways of the MR signal for an imaging sequence with alternating spoiling magnetic field gradients.

In the embodiment illustrated in FIG. 3, sequence blocks of the two types are alternatingly applied. $k_{0a}$ and $k_{0b}$ are coprime integer multiples of a unit spoiling gradient value $k_0$:

$$k_{0a} = n_a \cdot k_0,\ k_{0b} = n_b \cdot k_0$$

wherein $n_a$ and $n_b$ are coprime positive integer numbers. $k_0$ is a unit spoiling gradient moment large enough to de-phase the MR signal. In the example of FIG. 3, the combination $n_a=2$ and $n_b=11$ is used. FIG. 3 shows simulated phase diagrams (§ as function of time) to visualize different coherence pathways for the gradient echo sequence with alternating gradient moments ($n_a/n_b=2/11$), but for simplicity with fixed TRs for the two sequence block types. Coherence pathways leading to impure coherences (curves, a, b) and to pure coherences (curves c, d, e, f) are shown. The first impure coherences are refocused ($\phi=0$) not until a number of 21 sequence blocks. In contrast, pure coherences occur already after three sequence blocks (stimulated echoes, curves c and e) and four sequence blocks (spin echoes, curves d and f). Since 21 sequence blocks are required to generate the first impure coherence, while only three sequence blocks are required to create pure coherences, the undesirable impure coherences are diluted and damped by relaxation and, hence, are too weak to degrade the acquired MR signal data. Further, the spoiling gradient values $k_{0a}$ and $k_{0b}$ and the integers $n_a$ and $n_b$, respectively can be influenced by the sequence programmer on purpose, but the unknown main field inhomogeneity, which also contributes to the per TR accumulated phase cannot be influenced. It is important to note that thus, for a pure coherence the net contribution of all those main field inhomogeneity induced phases cancel in the echo, while for the impure coherences those additional phases do not vanish resulting in a non-zero phase at the time point of gradient induced echo formation. This effects results in a further dephasing of the impure signal contributions from the already long-pathway diluted impure coherences.

Figure 4:
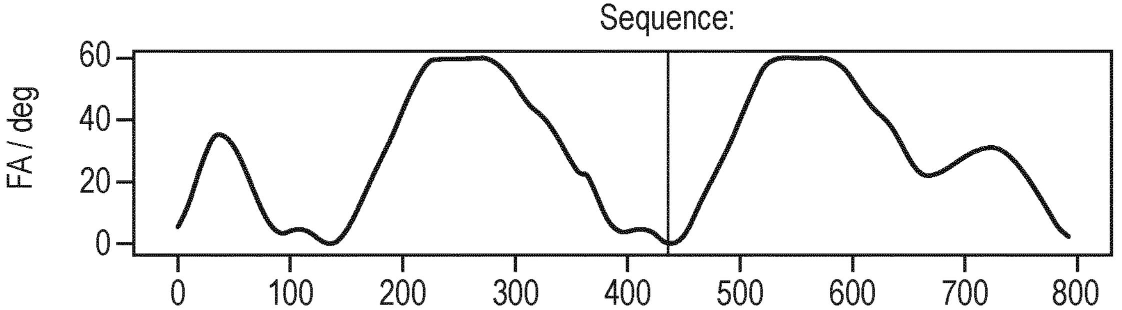
FIG. 4 schematically illustrates an MRF sequence design with alternating spoiling magnetic field gradients and the corresponding dictionaries for distinguishing between fat and water.
Figure 4:
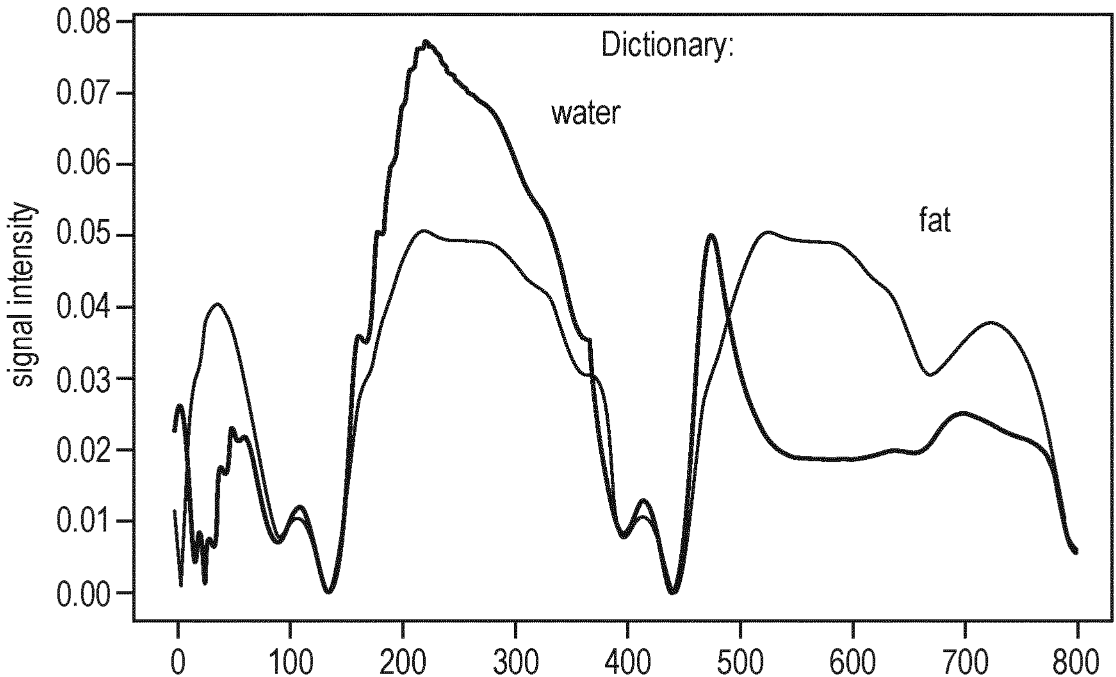

Experiments were performed on a 1.5T MRI scanner (Philips Ingenia) using water (Phantom Liquid 13) and oil (Spectrasyn 4) phantom bottles. For MRF according to the invention, a spoiled, interleaved spiral imaging sequence was used (1 mm resolution, 8 ms acquisition window, three shots with 800 sequence blocks per shot, repetition time TR=24 ms, undersampling factor 50/3) to map $T_1$, $T_2$ and ADC. The shots were preceded by an inversion RF pulse and had optimized flip angle variations. The top diagram in FIG. 4 shows the flip angle (FA) variation during the course of the imaging sequence to improve sensitivity for quantitative mapping. For the (approximately) first half of the train of sequence blocks small spoiling magnetic field gradients were used (b value about 0.2 s/mm$^2$) while for the second half of the MRF sequence strong spoiling magnetic field gradients were used (b value about 90 s/mm$^2$), which correspond to coprime factors of 3 and 59, respectively. In the experiments, the first impure coherence is refocused by the first pulse of the second half of the train of sequence blocks to a spin echo at the fourth pulse of the second half. Apart from coherence pathway dilution (only one pathway generates an impure coherence among many others that do not generate impure coherences) and relaxation damping also the $T_2$* decay due to the long echo time of more than one second contributes to the efficient suppression of this coherence.

For the employed sequence, dictionaries were calculated for a range of $T_1$, $T_2$ and ADC values, using the EPG formalism. The corresponding fingerprints of water and oil reflect the different diffusion constants of water and oil. The bottom diagram in FIG. 4 shows two fingerprints of water and oil reflecting the different diffusion coefficients of water and oil.

Figure 5:
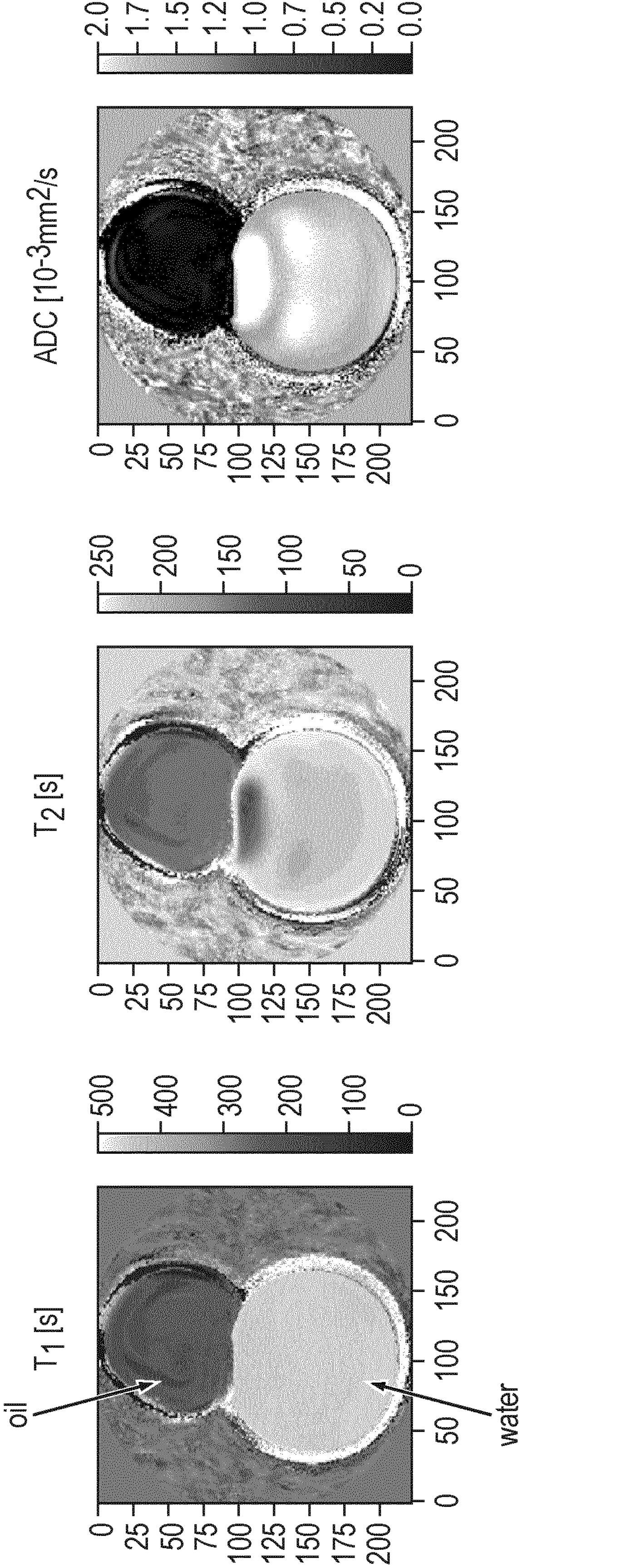
FIG. 5 shows MRF $T_1$, $T_2$ and ADC maps obtained from water and oil phantoms using the method of the invention.

From the dictionaries and the undersampled spiral images $T_1$, $T_2$ and ADC maps were fitted using a custom MRF simulation environment. The obtained maps are shown in FIG. 5. The maps show good agreement with expected values. Especially, the low and high ADC values of oil and water, respectively, could be successfully revealed. The results confirm that the variable spoiling magnetic field gradients allow differentiation between $T_2$ and diffusion.

The invention claimed is:

1. A method of magnetic resonance (MR) imaging of an object placed in an examination volume of an MR system, the method comprising:

subjecting the object to an imaging sequence composed of a train of sequence blocks, each sequence block comprising at least one RF pulse, at least one switched spoiling magnetic field gradient and at least one switched readout magnetic field gradient defining a k-space sampling pattern, and having associated therewith a set of acquisition parameters including the zeroth moment of the spoiling magnetic field gradient, the imaging sequence including two or more types of sequence blocks, wherein each type is assigned a fixed value of the zeroth moment of the spoiling magnetic field gradient and the fixed values are pairwise coprime integer multiples of a unit spoiling gradient value, acquiring the MR signals while varying at least the zeroth moment of the spoiling magnetic field gradient and, optionally, one or more further acquisition parameters during the course of the imaging sequence, and reconstructing at least one MR image, wherein at least a diffusion coefficient and, optionally, one or more further MR parameters are computed for a number of image positions from an incoherent temporal evolution of the acquired MR signals caused by the variation of the at least one acquisition parameter.

2. The method of claim 1, wherein the ratio of two fixed values is at least 5, preferably at least 10, most preferably at least 20.

3. The method of claim 1, wherein further acquisition parameters varied during the course of the imaging sequence are one or more of: repetition time, echo time, flip angle, RF pulse phase and/or frequency, k-space sampling pattern, readout magnetic field gradient, longitudinal magnetization preparation.

4. The method of claim 1, wherein said one or more MR further parameters computed from the temporal evolution of the acquired MR signals are one or more of: $T_1$, $T_2$, spin density, main magnetic field $B_0$, RF magnetic field $B_1$.

5. The method of claim 1, wherein the RF pulses of at least some of the sequence blocks are chemical shift-selective.

6. The method of claim 1, wherein said diffusion coefficient and said one or more further MR parameters are computed by matching the temporal evolution of the acquired MR signals at a given image position against a set of predicted MR signal evolution patterns.

7. The method of claim 6, wherein the predicted MR signal evolution patterns are computed using extended phase graphs.

8. A magnetic resonance (MR) system comprising: at least one main magnet coil configured to generate a main magnetic field within an examination volume, a number of gradient coils configured to generate switched magnetic field gradients in different spatial directions within the examination volume, at least one RF coil configured to generate RF pulses within the examination volume and/or for receiving MR signals from an object (10) positioned in the examination volume, a control computer configured to control a temporal succession of RF pulses and switched magnetic field gradients based on an examination protocol, and a reconstruction unit configured to reconstruct MR images from the received MR signals, wherein the MR system is configured to:

subject the object to an imaging sequence composed of a train of sequence blocks, each sequence block comprising at least one RF pulse, at least one switched spoiling magnetic field gradient and at least one switched readout magnetic field gradient defining a k-space sampling pattern, and having associated therewith a set of acquisition parameters including the zeroth moment of the spoiling magnetic field gradient, the imaging sequence including two or more types of sequence blocks, wherein each type is assigned a fixed value of the zeroth moment of the spoiling magnetic field gradient and the fixed values are pairwise coprime integer multiples of a unit spoiling gradient value, acquire the MR signals while varying at least the zeroth moment of the spoiling magnetic field gradient and, optionally, one or more further acquisition parameters during the course of the imaging sequence, and reconstruct at least one MR image, wherein at least a diffusion coefficient and, optionally, one or more further MR parameters are computed for a number of image positions from an incoherent temporal evolution of the acquired MR signals caused by the variation of the at least one acquisition parameter.

9. A computer program, which computer program comprises instructions stored on a non-transitory computer readable medium, for:

executing an imaging sequence composed of a train of sequence blocks, each sequence block comprising at least one RF pulse, at least one switched spoiling magnetic field gradient and at least one switched readout magnetic field gradient defining a k-space sampling pattern, and having associated therewith a set of acquisition parameters including the zeroth moment of the spoiling magnetic field gradient, the imaging sequence including two or more types of sequence blocks, wherein each type is assigned a fixed value of the zeroth moment of the spoiling magnetic field gradient and the fixed values are pairwise coprime integer multiples of a unit spoiling gradient value, and acquiring the MR signals while varying at least the zeroth moment of the spoiling magnetic field gradient and, optionally, one or more further acquisition parameters during the course of the imaging sequence.

10. The computer program of claim 9, further comprising instructions for reconstructing at least one MR image, wherein at least a diffusion coefficient and, optionally, one or more further MR parameters are computed for a number of image positions from an incoherent temporal evolution of the acquired MR signals caused by the variation of the at least one acquisition parameter.

* * * * *